United States Patent
Wernersson et al.

(10) Patent No.: US 11,621,346 B2
(45) Date of Patent: Apr. 4, 2023

(54) VERTICAL METAL OXIDE SEMICONDUCTOR FIELD EFFECT TRANSISTOR (MOSFET) AND A METHOD OF FORMING THE SAME

(71) Applicant: C2Amps AB, Limhamn (SE)

(72) Inventors: Lars-Erik Wernersson, Lund (SE); Olli-Pekka Kilpi, Lund (SE)

(73) Assignee: C2AMPS AB, Limhamn (SE)

( * ) Notice: Subject to any disclaimer, the term of this patent is extended or adjusted under 35 U.S.C. 154(b) by 362 days.

(21) Appl. No.: 16/611,888

(22) PCT Filed: May 8, 2018

(86) PCT No.: PCT/EP2018/061876
§ 371 (c)(1),
(2) Date: Nov. 8, 2019

(87) PCT Pub. No.: WO2018/206582
PCT Pub. Date: Nov. 15, 2018

(65) Prior Publication Data
US 2021/0280700 A1    Sep. 9, 2021

(30) Foreign Application Priority Data
May 12, 2017   (SE) .................................. 1750587-6

(51) Int. Cl.
*H01L 29/775*   (2006.01)
*H01L 21/02*    (2006.01)
(Continued)

(52) U.S. Cl.
CPC ...... *H01L 29/775* (2013.01); *H01L 21/02546* (2013.01); *H01L 21/02603* (2013.01);
(Continued)

(58) Field of Classification Search
CPC ............... H01L 29/0676; H01L 29/775; H01L 29/66469; H01L 29/78642; H01L 29/401;
(Continued)

(56) References Cited

U.S. PATENT DOCUMENTS

| 8,330,143 B2 * | 12/2012 | Wernersson | ........... B82Y 10/00 257/192 |
| 2009/0008630 A1 * | 1/2009 | Hurkx | ..................... H01L 29/78 257/E21.41 |

(Continued)

FOREIGN PATENT DOCUMENTS

| KR | 20080025147 A | 3/2008 | |
| WO | WO-2016207127 A1 * | 12/2016 | ............. B82Y 10/00 |

OTHER PUBLICATIONS

M. Berg, K.-M. Persson, O.-P. Kilpi, J. Svensson, E. Lind and L.-E. Wernersson, "Self-aligned, gate-last process for vertical InAs nanowire MOSFETs on Si," 2015 IEEE International Electron Devices Meeting (IEDM), 2015, pp. 31.2.1-31.2.4, doi: 10.1109/IEDM.2015.7409806. (Year: 2015).*

(Continued)

*Primary Examiner* — Errol V Fernandes
*Assistant Examiner* — Jeremy J Joy
(74) *Attorney, Agent, or Firm* — Brundidge & Stanger, P.C.

(57) ABSTRACT

A vertical metal oxide semiconductor field effect transistor (MOSFET) and a method for forming a vertical MOSFET is presented. The MOSFET comprises: a top contact; a bottom contact; a nanowire (602) forming a charge transport channel between the top contact and the bottom contact; and a wrap-around gate (650) enclosing the nanowire (602) circumference, the wrap-around gate (650) having an extension spanning over a portion of the nanowire (602) in a longitudinal direction of the nanowire (602), wherein the wrap-around gate (650) comprises a gate portion (614) and a field plate portion (616) for controlling a charge transport in the charge transport channel, and wherein the field plate portion (616) is arranged at a first radial distance (636) from the center of the nanowire (602) and the gate portion (614) is arranged at a second radial distance (634) from the center of (Continued)

the nanowire (602); characterized in that the first radial distance (636) is larger than the second radial distance (634).

11 Claims, 6 Drawing Sheets

(51) Int. Cl.
| | | |
|---|---|---|
| *H01L 21/765* | (2006.01) | |
| *H01L 29/06* | (2006.01) | |
| *H01L 29/40* | (2006.01) | |
| *H01L 29/423* | (2006.01) | |
| *H01L 29/66* | (2006.01) | |
| *H01L 29/786* | (2006.01) | |

(52) U.S. Cl.
CPC ...... *H01L 21/02653* (2013.01); *H01L 21/765* (2013.01); *H01L 29/0676* (2013.01); *H01L 29/401* (2013.01); *H01L 29/402* (2013.01); *H01L 29/42392* (2013.01); *H01L 29/66469* (2013.01); *H01L 29/66522* (2013.01); *H01L 29/66742* (2013.01); *H01L 29/78642* (2013.01); *H01L 29/78681* (2013.01); *H01L 29/78696* (2013.01)

(58) Field of Classification Search
CPC ............. H01L 29/402; H01L 29/42392; H01L 29/7827; H01L 29/42368; H01L 29/42376; H01L 29/66666; H01L 29/66439; H01L 29/068; H01L 29/78696; H01L 21/02603; H01L 21/823487; H01L 27/2454

See application file for complete search history.

(56) References Cited

U.S. PATENT DOCUMENTS

| | | | | |
|---|---|---|---|---|
| 2011/0169012 A1* | 7/2011 | Hersee | ................ | H01L 29/7788 257/E21.451 |
| 2013/0264544 A1* | 10/2013 | Karg | ................... | H01L 29/0676 257/24 |
| 2013/0313525 A1* | 11/2013 | Rosaz | ................... | B82Y 10/00 257/29 |
| 2016/0149001 A1* | 5/2016 | Oxland | ................. | H01L 29/775 257/191 |
| 2016/0204224 A1* | 7/2016 | Fukui | ................ | H01L 21/02381 438/198 |
| 2017/0092777 A1* | 3/2017 | Vielemeyer | ........... | H01L 29/402 |
| 2018/0069131 A1* | 3/2018 | Balakrishnan | .... | H01L 29/42392 |
| 2018/0219084 A1* | 8/2018 | Wernersson | ........... | B82Y 40/00 |
| 2018/0248018 A1* | 8/2018 | Park | .................. | H01L 29/78618 |
| 2019/0371911 A1* | 12/2019 | Miao | ................... | H01L 29/7391 |

OTHER PUBLICATIONS

B. Yang et al., "CMOS compatible Gate-All-Around Vertical silicon-nanowire MOSFETs," ESSDERC 2008—38th European Solid-State Device Research Conference, 2008, pp. 318-321, doi: 10.1109/ESSDERC.2008.4681762. (Year: 2008).*

Berg et al. (Self-Aligned, gate-last process for verticall nAs nanowire MOSFETs on Si, IEEE International Electron Devices Meeting (IEDM), 2015, pp. 31.2.1-31.2.4, doi: 10.1109/IEDM.2015.7409806) (Year: 2015).*

Berg et al., Self-Aligned, gate-last process for vertical InAs nanowire MOSFETs on Si, IEEE International Electron Devices Meeting (IEDM), 2015, pp. 31.2.1-31.2.4, doi: 10.1109/IEDM.2015.7409806 (Year: 2015).*

Yang et al., CMOS Compatible Gate-All-Around Vertical Silicon-Nanowire MOSFETs, ESSDERC 2008—38th European Solid-State Device Research Conference, 2008, pp. 318-321, doi:10.1109/ESSDERC.2008.4681762 (Year: 2008).*

Korean Office Action dated Oct. 22, 2020.

B. Yang, et al, "CMOS Compatible Gate-All-Around Vertical Silicon—Nanowire MOSFETs", 2014 44th European Solid State Device Research Conference (ESSDERC), Nov. 18, 2008, pp. 318-321.

Berg Martin, et al: "Self-aligned, Gate-last Process for Vertical InAs nanowire MOSFETs on Si", 2015 IEEE International Electron Devices Meeting (IEDM), IEEE, Dec. 7, 2015, pp. 31.2.1-31.2.4.

International Search Report from International Application No. PCT/EP2018/061876, dated Aug. 20, 2018.

* cited by examiner

VERTICAL METAL OXIDE SEMICONDUCTOR FIELD EFFECT TRANSISTOR (MOSFET) AND A METHOD OF FORMING THE SAME

TECHNICAL FIELD

The present invention relates to a vertical metal oxide semiconductor field effect transistor (MOSFET) and a method of forming the same.

BACKGROUND

III-V MOSFETs integrated on Si substrates, such as InAs and InGaAs, are considered to extend Moore's law, as they offer the possibility to decrease the supply voltage and therefore power consumption, while operating with a high performance. Continuous scaling of the MOSFET gate length has led to an increase in the off-state power consumption due to leakage.

Vertical vapor-liquid-solid (VLS) grown nanowires in III-V materials offer an interesting option as channel material in vertical III-V MOSFETs, as the vertical growth direction allows high degree of freedom for the material selection. Thin nanowires can relax stress related to lattice mismatch by lateral expansion. One major driving force for the development has been the possibility to integrate high mobility and direct band gap III-V materials on Si.

Self-aligned gate technology is essential to reduce the parasitics in nanowire MOSFETs that otherwise will limit the drive current and transconductance. For vertical nanowire MOSFETs, a process has been described (WO/2016/207127) where the top metal first is deposited to define the top ohmic contact and subsequently used to etch a recess gate below the metal. The process technology allows an accurate positioning of the gate electrode along the vertical nanowires. However, dielectric spacer layers are also essential to separate the gate electrode from the source and drain regions to reduce the parasitic capacitances. There is therefore a need for developing new nanowire MOSFETs to improve device performance, and in particular to reduce leakage currents.

SUMMARY OF THE INVENTION

It is an object of the present inventive concept to at least reduce the above problems by providing a vertical metal oxide semiconductor field effect transistor (MOSFET) and a method of forming a vertical metal oxide semiconductor field effect transistor (MOSFET).

It is another object to provide such a vertical MOSFET and method for forming the same that allows for a reduced leakage current and hence an enhanced control.

According to a first aspect, the above and other objects are achieved by a vertical metal oxide semiconductor field effect transistor (MOSFET). The MOSFET comprising: a top contact; a bottom contact; a nanowire forming a charge transport channel between the top contact and the bottom contact; and a wrap-around gate enclosing the nanowire circumference, the wrap-around gate having an extension spanning over a portion of the nanowire in a longitudinal direction of the nanowire, wherein the wrap-around gate comprises a gate portion and a field plate portion for controlling a charge transport in the charge transport channel, and wherein the field plate portion is arranged at a first radial distance from the center of the nanowire and the gate portion is arranged at a second radial distance from the center of the nanowire; characterized in that the first radial distance is larger than the second radial distance.

By means of the present vertical MOSFET it is possible to decrease the output conductance, to increase the breakdown voltage of the MOSFET, and to suppress the tunneling leakage current.

The top contact may be formed prior to the wrap-around gate. The top contact may be formed using a method for a vertical gate-last process. The top contact may be directly connected to a top portion of the nanowire. The top contact may be indirectly connected to the top portion of the nanowire. The top contact may be in electrical contact with the nanowire. The top contact may be a first ohmic contact to the nanowire. The top contact may be an ohmic contact. The top contact may comprise a metal contact. The top contact may comprise a semiconductor contact region. The top contact may be in electrical contact to a drain. The top contact may be the drain.

The bottom contact may be formed prior to the wrap-around gate. The bottom contact may be directly connected to a bottom portion of the nanowire. The bottom contact may be indirectly connected to the bottom portion of the nanowire. The bottom contact may be in electrical contact with the nanowire. The bottom contact may be a second ohmic contact to the nanowire. The bottom contact may be an ohmic contact. The bottom contact may be in electrical contact to a source. The bottom contact may be the source.

Thus, it is to be understood that the function of top contact and the bottom contact may be interchanged.

The nanowire may form a charge transport channel between the top contact and the bottom contact. In other words, the top contact and the bottom contact is electrically connected via the nanowire. The nanowire may form a charge transport channel for charge carriers. The nanowire may be a semiconductor nanowire. The nanowire may be a III-V semiconductor nanowire. The nanowire may alternatively be a group IV nanowire. The nanowire may comprise InAs, InGaAs, GaSb, Si, GaAsSb, or combinations thereof. The nanowire may have a homogenous material composition. The nanowire may be homogenous in doping level. The nanowire may comprise annular layers of varying doping levels. The nanowire may comprise an outer annular layer of higher doping level than an inner annular layer of the nanowire. The nanowire may be a core-shell nanowire. The core and the shell may be formed by different materials. The core and the shell may alternatively be of the same material but differ in doping concentration. The nanowire may be used as a transistor channel.

The wrap-around gate encloses the nanowire circumference. The wrap-around gate is located below the top contact. The wrap-around gate is located above the bottom contact. It is to be understood that "above" and "below" are positions relative the longitudinal direction of the nanowire. The wrap-around gate may be a layered structure. The wrap-around gate may comprise a metal layer.

The wrap-around gate has an extension spanning over a portion of the nanowire in a longitudinal direction of the nanowire.

The wrap-around gate comprises a gate portion and a field plate portion for controlling a charge transport in the charge transport channel. The charge transport in the charge transport channel may be controlled by applying a gate voltage. In other words, the transport of charge carriers between the source and the drain may be controlled by applying a voltage to the gate. The gate portion and the field plate portion may be integrally formed. The field plate portion and the gate portion may be formed as two separate elements. The field plate portion and the gate portion may be in electrical contact with each other. The field plate portion and the gate portion may be formed by different materials. The different material may be different metals. The different metals may have different work functions. The gate portion may be stepped. The gate portion and the field plate portion may form a stepped structure.

The field plate portion is arranged at a first radial distance from the center of the nanowire. The field plate portion may be arranged at a first radial distance from the center of the nanowire by means of a separating dielectric layer having a second thickness in a radial direction of the nanowire.

The gate portion is arranged at a second radial distance from the center of the nanowire. The gate portion may be arranged at a second radial distance from the center of the nanowire by means of a separating dielectric layer having a first thickness in a radial direction of the nanowire. The wrap-around gate may be formed as a stacked structure, generally referred to as a gate stack. The separating dielectric layer may form part of the gate stack.

An advantage of arranging the field plate portion at the first radial distance from the center of the nanowire and the gate portion at the second radial distance from the center of the nanowire may be additional control of an electrical potential of a portion of the charge transport channel. This as the electric field within the charge transport channel is dependent on the radial distance to the center of the nanowire. In other words, the potential of a portion of the charge transport channel enclosed by the wrap-around gate may be tailored by varying the first and second radial distances.

The separating dielectric layer having a second thickness and the separating dielectric layer having a first thickness may be made of the same dielectric material. The separating dielectric layer having a second thickness and the separating dielectric layer having a first thickness may be made of different dielectric materials.

The first radial distance is larger than the second radial distance. In other words, the field plate portion is arranged at a larger radial distance from the center of the nanowire than the gate portion.

An advantage of the first radial distance being larger than the second radial distance is that the tunneling distance between the gate portion and the drain for the charge carriers is increased when a gate voltage is applied. In other words, the effective gate length of the vertical MOSFET may be increased and a reduced electric field on the drain side. An advantage of an increased tunneling distance between the gate portion and the drain for the charge carriers may be a decrease of the output conductance when a gate voltage is applied. An advantage of an increased tunneling distance between the gate portion and the drain for the charge carriers may be an increased breakdown voltage when a gate voltage is applied. An advantage of an increased tunneling distance between the gate portion and the drain for the charge carriers may be a suppression of the tunneling leakage current. A reduced impact ionization may further be achieved. Higher operating voltages may further be applied to the vertical MOSFET.

The field plate portion may be displaced relative to the gate portion along the longitudinal direction of the nanowire.

A material composition of the nanowire may vary along the longitudinal direction of the nanowire.

An advantage of varying the material composition along the longitudinal direction of the nanowire may be that the bandgap of the nanowire may be tailored along the longitudinal direction of the nanowire. An advantage of varying the material composition along the longitudinal direction of the nanowire may be a reduction of the off-state power consumption. In other words, a lower gate voltage may be needed in the off-state of the MOSFET.

The material composition of the nanowire along the longitudinal direction of the nanowire may vary gradually, which may be advantageous in that properties of the vertical MOSFET may be further improved. The nanowire may comprise a graded heterojunction. The nanowire may comprise a graded $In_xGa_{1-x}As$ heterostructure.

The material composition of the nanowire along the longitudinal direction of the nanowire may be segmented, which may be advantageous in that properties of the vertical MOSFET may be further improved. The nanowire may be formed by axial segments of varying material composition. The nanowire may be formed by axial segments of varying doping. The nanowire may be an axial heterostructure nanowire. The nanowire may have segments of two or more different materials and doping levels.

The material composition of the nanowire may vary such that a bandgap of the nanowire is larger adjacent to the field plate portion than adjacent to the gate portion. In other words, the field plate portion may be arranged in a way that the wrap-around gate is further away from the center of the nanowire in a region with higher bandgap, whereas the wrap-around gate is closer to the center of the nanowire in a region with narrower bandgap.

An advantage of varying the material composition in such way is that the additional tailoring of the bandgap of a portion of the nanowire adjacent to the field plate portion increases the effective gate length. A further increase in tunneling distance between the gate portion and the drain for the charge carriers may thereby be achieved. A suppression of the tunneling leakage current is therefore achieved.

A material composition of the nanowire may comprise $In_xGa_{1-x}As$.

An advantage of the material composition of the nanowire comprising $In_xGa_{1-x}As$ may be the possibility of changing the bandgap of the nanowire.

The wrap-around gate may comprise a high-k dielectric. The high-k dielectric may comprise $Al_2O_3$, $HfO_2$, $ZrO_2$, $SiN_x$, $SiO_2$, or combinations thereof.

An advantage of the high-k dielectric may be an increased gate portion capacitance.

A radial extension of the nanowire may be smaller at the gate portion than at the field plate portion. In other words, the gate portion may be recessed. The recess may be formed by etching of the nanowire.

An advantage of a recessed gate portion may be a reduction of a parasitic resistance. An advantage of a recessed gate portion may be additional tailoring of the electric potential when a gate voltage is applied.

The nanowire may have a radial extension in a range of 2.5 nm to 25 nm.

The gate portion may have an extension in the longitudinal direction of the nanowire in a range of 10 nm to 500 nm. The field plate portion may have an extension in the longitudinal direction of the nanowire in a range of 10 nm to 1000 nm. Preferably, the gate portion is 20-50 nm and the field plate portion is about 50 nm.

A ratio between the first radial distance and the second radial distance may be in a range of 1.1 to 5, which may be advantageous in that properties of the vertical MOSFET may be further improved.

According to a second aspect the present disclosure relates to a method for forming a vertical metal oxide semiconductor field effect transistor (MOSFET) on a substrate having a vertical nanowire arranged on a first major surface of the substrate, the method comprising: forming a dielectric layer covering outer surfaces of the nanowire and a portion of the first major surface of the substrate adjacent to the nanowire; forming a first horizontal sacrificial layer covering the dielectric layer around a bottom portion of the nanowire; removing exposed portions of the dielectric layer using the first sacrificial layer as an etch mask; removing the first sacrificial layer; forming a gate stack layer covering remaining portions of the dielectric layer and exposed portions of the nanowire, wherein the gate stack layer comprises a high-k dielectric; depositing a metal layer covering the gate stack layer; forming a second horizontal sacrificial layer covering the metal layer around a bottom portion of the nanowire; removing exposed portions of the metal layer using the second sacrificial layer as an etch mask; removing exposed portions of the gate stack layer using the second sacrificial layer as an etch mask; removing the second sacrificial layer, thereby exposing a wrap-around gate enclosing the nanowire circumference, the wrap-around gate being formed of remaining portions of the gate stack layer and the metal layer; and forming a top contact at a top portion of the nanowire.

According to the present method, a vertical MOSFET is formed on a substrate having a vertical nanowire arranged on a first major surface of the substrate. The vertical MOSFET may be formed on a semiconductor substrate. For instance, the semiconductor substrate may be Si or III-V compound material. The nanowire may be grown directly on the substrate. The nanowire may be grown on an epitaxial layer deposited on the semiconductor substrate. III-V or group IV nanowires may be grown using metal organic vapor-phase epitaxy using the vapor-liquid-solid method on electron-beam defined Au particles with typical sizes of 5 to 50 nm. Alternatively, other methods to grow the nanowire may be used, such as growth on substrates with dielectric masks. The dielectric masks may be made of $SiO_2$ or $SiN_x$. The nanowire may also be defined by etching of a semiconductor wafer in a top-down process. Furthermore, the nanowire may be exposed to a regrowth step, where one or more masks are used along the nanowire to allow for semiconductor material deposition in one, two, or more areas along the nanowire. The nanowire may be homogenous in material composition. The nanowire may be homogenous in doping level. The nanowire may be formed by axial segments of varying doping. The nanowire may be formed by axial segments of varying material composition. For instance, the nanowire may have a 200 nm long undoped bottom section followed by a 400 nm long highly doped section.

According to the present method, a dielectric layer is formed. The dielectric layer covers outer surfaces of the nanowire and a portion of the first major surface of the substrate adjacent to the nanowire. The dielectric layer may be deposited by atomic layer deposition (ALD). The dielectric layer may be deposited by chemical vapor deposition (CVD). The dielectric layer may be $SiO_2$. The dielectric layer may be SiN. The dielectric layer may be 50-100 nm thick.

According to the present method, a first horizontal sacrificial layer is formed. The first horizontal sacrificial layer covers the dielectric layer around a bottom portion of the nanowire. The first horizontal sacrificial layer may be a photo resist layer. The first horizontal sacrificial layer may be made of hydrogen silsesquioxane (HSQ). The first horizontal sacrificial layer may be 100 nm thick.

According to the present method, exposed portions of the dielectric layer are removed using the first sacrificial layer as an etch mask. The exposed portions of the dielectric layer may be removed by wet etching chemistry. The exposed portions of the dielectric layer may be removed by dry etching chemistry.

According to the present method, the first sacrificial layer is removed.

According to the present method, a gate stack layer is formed. The gate stack layer covers remaining portions of the dielectric layer and exposed portions of the nanowire. The gate stack layer comprises a high-k dielectric. The high-k dielectric may be deposited by ALD. The high-k dielectric may be $Al_2O_3$, $HfO_2$, $ZrO_2$, or combinations thereof.

According to the present method, a metal layer covering the gate stack layer is deposited. The metal layer may be deposited by metal evaporation. The metal layer may be deposited by sputtering. The metal layer may be deposited by CVD.

According to the present method, a second horizontal sacrificial layer is formed. The second horizontal sacrificial layer covers the metal layer around a bottom portion of the nanowire. The second horizontal sacrificial layer may be made of HSQ.

According to the present method, exposed portions of the metal layer using the second sacrificial layer as an etch mask are removed. The exposed portions of the metal layer may be removed by wet etching chemistry. The exposed portions of the metal layer may be removed by dry etching chemistry.

According to the present method, exposed portions of the gate stack layer using the second sacrificial layer as an etch mask are removed. The exposed portions of the gate stack layer may be removed by wet etching chemistry. The exposed portions of the gate stack layer may be removed by dry etching chemistry.

According to the present method, the second sacrificial layer is removed, thereby exposing a wrap-around gate enclosing the nanowire circumference. The wrap-around gate is formed of remaining portions of the gate stack layer and the metal layer.

According to the present method, a top contact is formed at a top portion of the nanowire.

In general, features of this aspect of the inventive concept provide similar advantages as discussed above in relation to the previous aspect of the invention, why said advantages will not be repeated in detail to avoid undue repetition.

The method may further comprise: forming a coating on an upper portion of the nanowire prior to forming the dielectric layer.

According to the present method, a coating on an upper portion of the nanowire may be formed prior to forming the dielectric layer. The coating may be a metal. The coating may be a semiconductor.

The method may further comprise: etching the nanowire, subsequent to removing the first sacrificial layer and prior to forming the gate stack layer, using the coating and/or the dielectric layer as an etch mask, thereby locally decreasing a radial extent of the nanowire.

According to the present method, the nanowire may be etched, subsequent to removing the first sacrificial layer and prior to forming the gate stack layer. The nanowire may be etched using the coating and/or the dielectric layer as an etch mask, thereby locally decreasing the radial extent of the nanowire. The nanowire may be etched by etching an oxide formed on the nanowire. The nanowire may be etched by atomic layer etching.

An upper surface of the second sacrificial layer may define a height of the wrap-around gate. In other words, the height of the wrap-around gate is determined by the thickness of the second sacrificial layer.

A further scope of applicability of the present disclosure will become apparent from the detailed description given below. However, it should be understood that the detailed description and specific examples, while indicating preferred variants of the present inventive concept, are given by way of illustration only, since various changes and modifications within the scope of the inventive concept will become apparent to those skilled in the art from this detailed description.

Hence, it is to be understood that this inventive concept is not limited to the particular component parts of the device described or steps of the methods described as such device and method may vary. It is also to be understood that the terminology used herein is for purpose of describing particular embodiments only, and is not intended to be limiting. It must be noted that, as used in the specification and the appended claim, the articles "a", "an", "the", and "said" are intended to mean that there are one or more of the elements unless the context clearly dictates otherwise. Thus, for example, reference to "a unit" or "the unit" may include several devices, and the like. Furthermore, the words "comprising", "including", "containing" and similar wordings does not exclude other elements or steps.

BRIEF DESCRIPTION OF THE DRAWINGS

The aspects of the present inventive concept, including its particular features and advantages, will be readily understood from the following detailed description and the accompanying drawings. The figures are provided to illustrate the general structures of the inventive concept. Like reference numerals refer to like elements throughout.

DETAILED DESCRIPTION

Figure 1A:
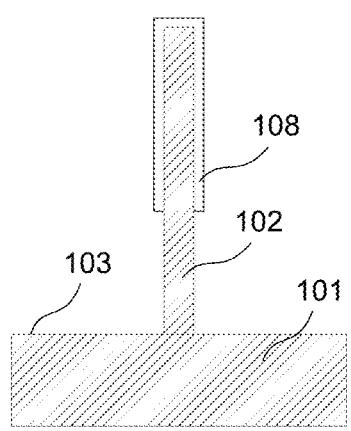
FIG. 1A-G illustrates a process flow describing how to fabricate a field-plate on a vertical nanowire.

The present inventive concept will now be described more fully hereinafter with reference to the accompanying drawings, in which currently preferred variants of the inventive concept are shown. This inventive concept may, however, be implemented in many different forms and should not be construed as limited to the variants set forth herein; rather, these variants are provided for thoroughness and completeness, and fully convey the scope of the present inventive concept to the skilled person.

A vertical MOSFET 600 will now be described with reference to FIG. 6A-C. The vertical MOSFET 600 shown in FIG. 6A comprises a vertical nanowire 602. The material composition of the vertical nanowire 602 in FIG. 6A varies along the longitudinal direction 601 of the vertical nanowire 602. More specifically, the vertical nanowire 602 comprises a graded material composition, in this case a graded $In_xGa_{1-x}As$ heterostructure, where the Ga content is gradually varied. The vertical nanowire 602 therefore comprises a graded heterojunction. The Ga content of the vertical nanowire 602 is varied such that a bandgap of the vertical nanowire 602 is larger adjacent to the field plate portion 616 than adjacent to the gate portion 614. In other words, the field plate portion 616 is arranged such that the wrap-around gate 650 is further away from the center of the vertical nanowire 602 in a region with higher bandgap, whereas the wrap-around gate 650 is closer to the center of the vertical nanowire 602 in a region with narrower bandgap. The vertical nanowire 602 may comprise other material compositions, such as InAs, InGaAs, $In_xGa_{1-x}As$, GaSb, Si, or combinations thereof. The vertical nanowire 602 may be a III-V nanowire or a group IV nanowire. Also, the doping level of the vertical nanowire 602 may be homogenous. The material composition of the vertical nanowire 602 may also be varied along the longitudinal direction of the vertical nanowire 602 in segments. For example, the vertical nanowire 602 may be formed by axial segments of varying material composition and/or by axial segments of varying doping, where segments have two or more different materials and doping levels. The vertical nanowire 602 may be an axial heterostructure nanowire. Bandgaps for nanowires 602 of different material compositions will be described in relation to FIG. 8A-C.

Figure 6A:
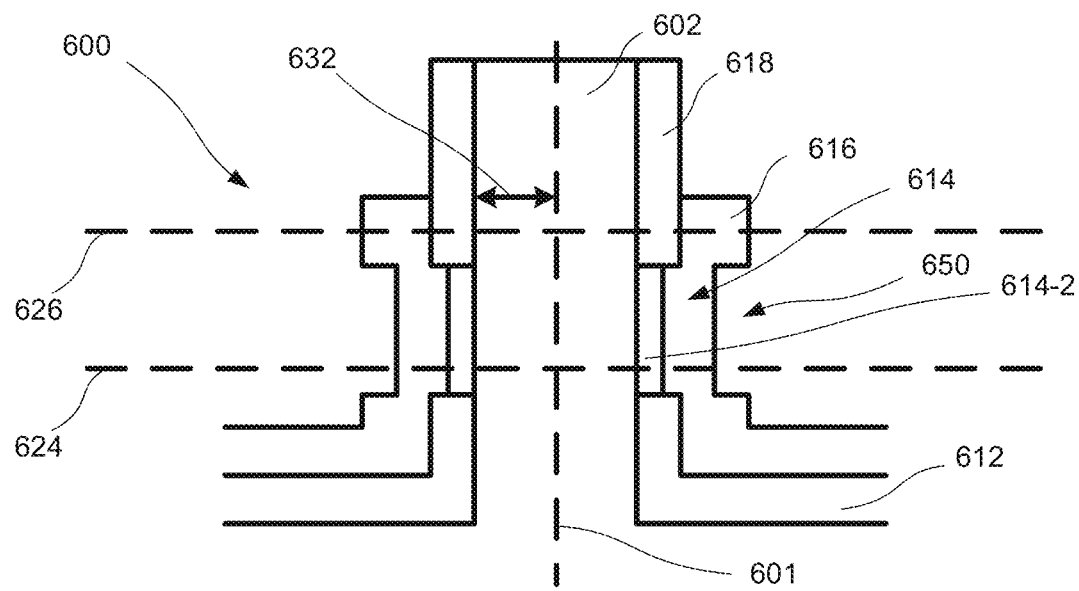
FIG. 6A is a schematic illustration of a prestate vertical nanowire MOSFET.

The vertical nanowire 602 in FIG. 6A has a constant radial extent 632. Typically, the radial extension 632 of the vertical nanowire 602 is in a range of 2.5 nm to 25 nm. The vertical nanowire 602 may be etched such that the radial extent 632 of the vertical nanowire 602 is varied. The radial extent of the nanowire may for example be smaller adjacent to the gate portion than adjacent to the filed plate portion.

The nanowire 602 forms a charge transport channel between a top contact and a bottom contact of the MOSFET. The vertical nanowire 602 in FIG. 6A is used as a transistor channel. In order to increase readability of FIG. 6A, the top contact and the bottom contact of the MOSFET are not shown. It is to be understood that the top contact may be connected to a top portion of the vertical nanowire 602, and that the bottom contact may be connected to a bottom portion of the vertical nanowire 602. In the vertical MOSFET 600 shown in FIG. 6A, the top portion of the vertical nanowire 602 is connected to a drain, and the bottom portion of the vertical nanowire 602 is connected to a source. In other version, the top portion of the vertical nanowire 602 may be connected to the source, and the bottom portion of the vertical nanowire 602 may be connected to the drain. In other words, the vertical nanowire 602 forms a charge transport channel between the source and the drain.

The vertical MOSFET 600 in FIG. 6A further comprises a basis 612, a wrap-around gate 650, and a dielectric layer 618. The wrap-around gate 650 encloses the vertical nanowire 602 circumference. As is shown in FIG. 6A, the wrap-around gate 650 spans over a portion of the vertical nanowire 602 in a longitudinal direction 601 of the vertical nanowire 602. The wrap-around gate 650 comprises a gate portion 614 and a field plate portion 616 for controlling the flow of charge carriers in the charge transport channel. Typically, the gate portion 614 has an extension in the longitudinal direction of the vertical nanowire 602 in a range of 10 nm to 500 nm, and the field plate portion 616 has an extension in the longitudinal direction of the vertical nanowire 602 in a range of 10 nm to 1000 nm. Preferably, the gate portion 614 is 20-50 nm and the field plate portion 616 is about 50 nm. The charge transport between the source and the drain may be controlled by applying a voltage to the gate portion 614. In the depicted MOSFET 600 in FIG. 6A the gate portion 614 is arranged below the field plate portion 616, however, the gate portion 614 may be arranged above the field plate portion 616. The gate portion 614 and the field plate portion 616 are integrally formed in the form of a stepped structure in FIG. 6A. However, the gate portion 614 and the field plate portion 616 may be formed as two separate elements. In case the gate portion 614 and the field plate portion 616 are formed as two separate elements, they may be made of different material, such as metals with different work functions, and they may be in electrical contact with each other. In FIG. 6A, the gate portion 614 and the field plate portion 616 are arranged adjacent to one another. The field plate portion 616 may, however, be displaced relative to the gate portion 614 along the longitudinal direction of the vertical nanowire 602.

The wrap-around gate 650 in FIG. 6A is a layered structure with a material composition that comprises a high-k dielectric layer 614-2 and a metal layer. The high-k dielectric layer 614-2 in FIG. 6A and FIG. 6C comprises $Al_2O_3$. However, the high-k dielectric layer 614-2 may comprise $HfO_2$, $ZrO_2$, both in combination with each other, with $Al_2O_3$, or alone. In the example depicted in FIG. 6A, the dielectric layer 618 and the high-k dielectric layer 614-2 are made of different dielectric materials. However, the dielectric layer 618 and the high-k dielectric layer 614-2 may be made of the same dielectric material. The thickness of the dielectric layer 618 may be different from the thickness of the high-k dielectric layer 614-2.

In the above section the layer 614-2 has been referred to as a high-k dielectric layer, i.e. a layer having a high dielectric constant as compared to silicon dioxide. The skilled person, however, realizes that the high-k dielectric layer 614-2 may alternatively be formed by another dielectric material, such as silicon dioxide.

In FIG. 6A, the high-k dielectric layer 614-2 of the wrap-around gate 650 of the MOSFET 600, is explicitly shown only adjacent to the gate portion 614. However, the high-k dielectric layer 614-2 is a layer of the wrap-around gate 650. In case the radial extent 632 of the vertical nanowire 602 is varied, the radial extent 632 of the vertical nanowire 602 is typically smaller at the gate portion 614 than at the field plate portion 616. In other words, the gate portion 614 may be recessed. The field plate portion 616 is separated from the vertical nanowire 602 by means of the dielectric layer 618.

Figure 6B:
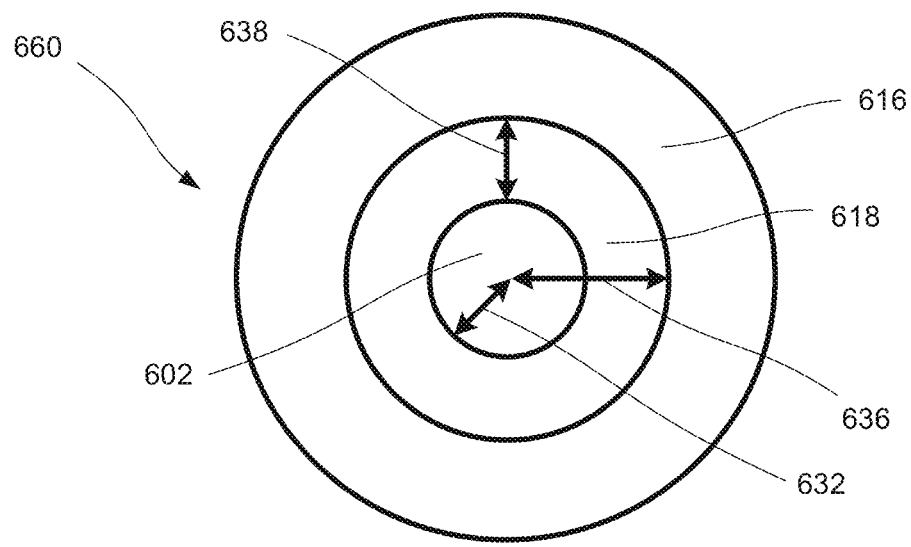
FIG. 6B is a cross section taken along line $\phi_2$ in FIG. 6A.

FIG. 6B shows a cross section 660 along the plane 626 of the vertical MOSFET 600, i.e. in a plane perpendicular to the longitudinal direction 601 of the vertical nanowire 602. As is shown in FIG. 6B, the field plate portion 616 is arranged at a first radial distance 636 from the center of the vertical nanowire 602. The first radial distance 636 is defined by the radial extent 632 of the vertical nanowire 602 and a thickness 638 of the dielectric layer 618.

Figure 6C:
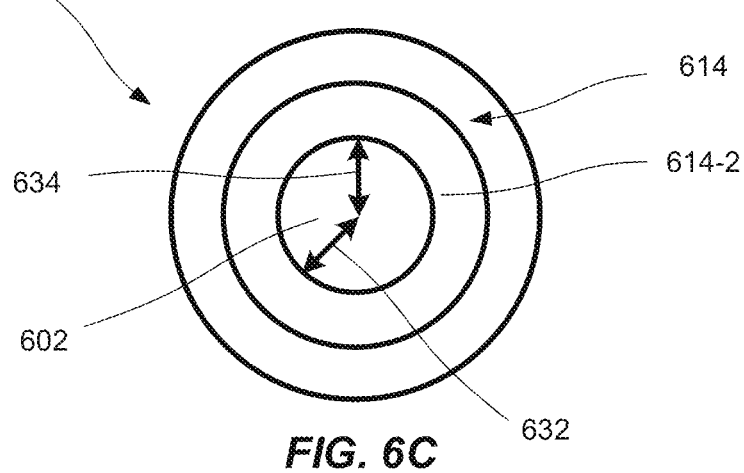
FIG. 6C is a cross section taken along line $\phi_1$ in FIG. 6A.

FIG. 6C shows a cross section 640 along the plane 624 of the vertical MOSFET 600. As is shown in FIG. 6C, the gate portion 614, comprising the high-k dielectric layer 614-2, is arranged at a second radial distance 634 from the center of the vertical nanowire 602. The second radial distance 634 is defined by the radial extent 632 of the vertical nanowire 602 at the gate portion 614. In the example shown in FIG. 6A, the first radial distance 636 is larger than the second radial distance 634. Typically, a ratio between the first radial distance 636 and the second radial distance 634 is in a range of 1.1 to 5.

Figure 7A:
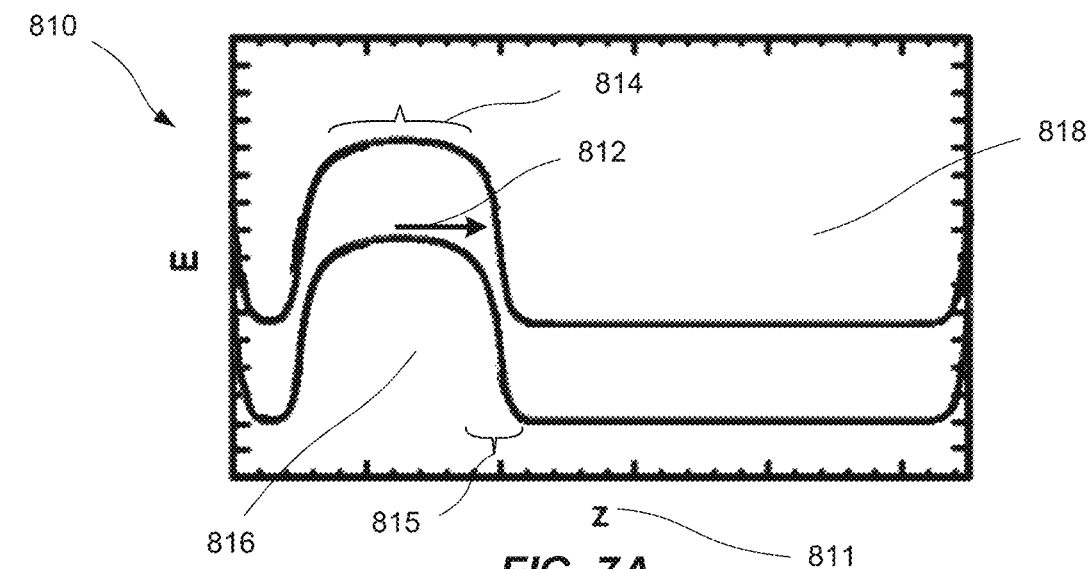
FIG. 7A is a graphical representation of bandgap for a nanowire of homogenous material composition.
Figure 7B:
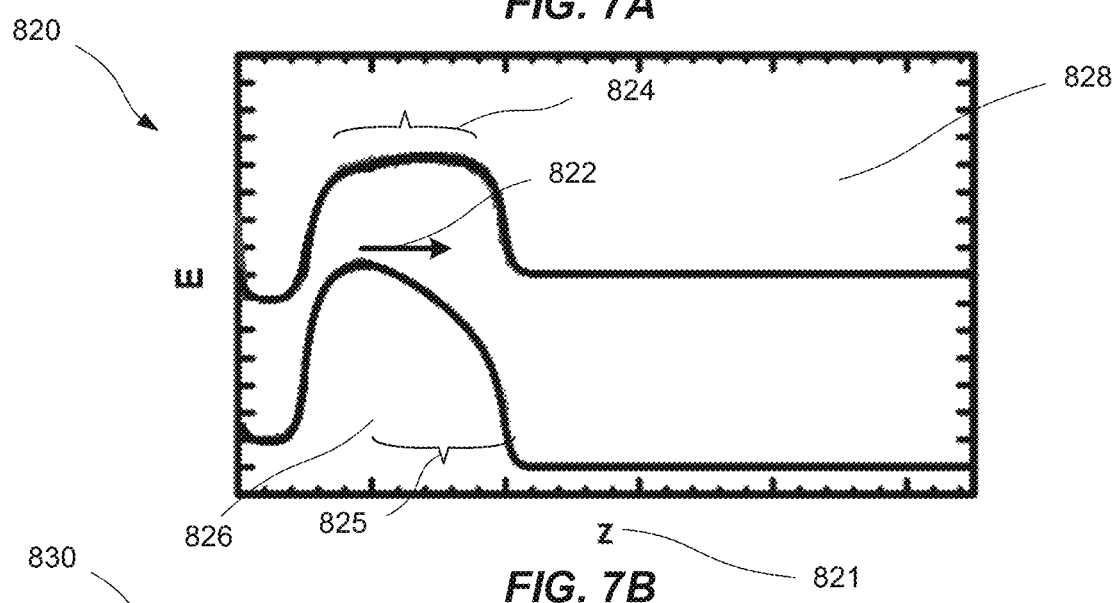
FIG. 7B is a graphical representation of bandgap for a nanowire of graded material composition.
Figure 7C:
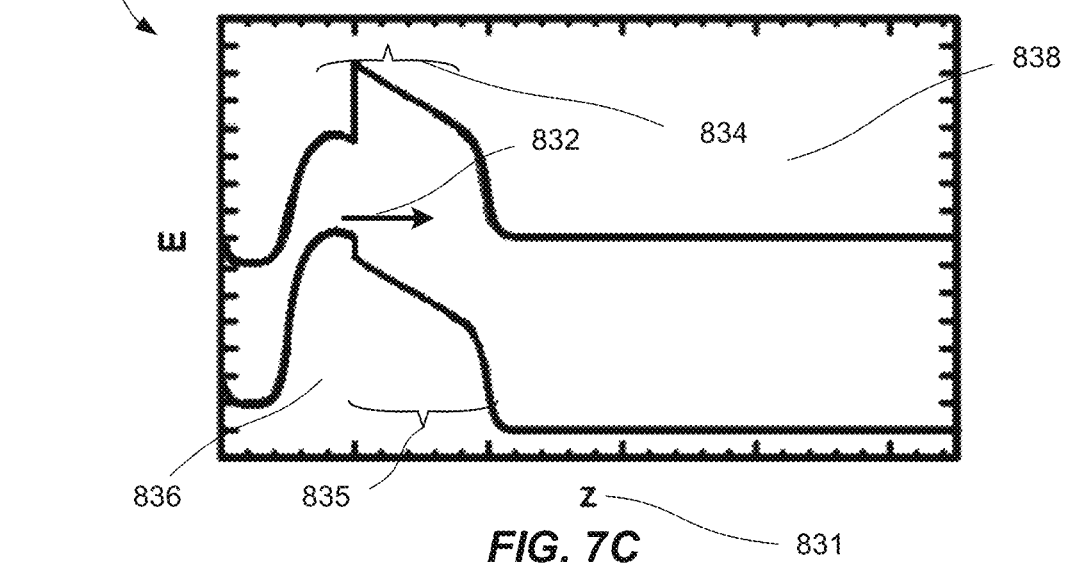
FIG. 7C is a graphical representation of bandgap for a nanowire of segmented material composition.

FIG. 7A is a graphical representation 810 of bandgap for a vertical nanowire of homogenous material composition. In the example depicted in FIG. 7A, the material composition is InAs. Also, the graphical representations 810, 820, 830 in FIG. 87-C are bandgap diagrams of vertical nanowires including a wrap-around gate void of field plate portions. FIG. 7A-C are included to discuss how the bandgap structures of the vertical nanowire may enhance the effect of the field plate portion 616 in the vertical MOSFET 600. In the following, portions 814, 824, 834 of the bandgap diagrams extend along the longitudinal directions z 811, 821, 831 of the vertical nanowires. The portions 814, 824, 834 of the bandgap diagrams corresponds to actual portions along the vertical nanowires where a respective gate portion is present, similar to the gate portion 614 in FIG. 6A. Charge carriers in a valence band 816, 826, 836 of the respective portions 814, 824, 834 of the vertical nanowires may tunnel to a respective conduction band 818, 828, 838 of the vertical nanowires in a direction 812, 822, 832 as schematically illustrated in FIG. 7A-C. From FIG. 7A it is clear that charge carriers may tunnel from the valence band 816 of the portion 814 of the vertical nanowire to the conduction band 818 of the vertical nanowire. In other words, the charge carriers may tunnel over a tunneling distance 815 as illustrated in the figure. In case the vertical nanowire comprises a graded material composition, as is the case in FIG. 7B, a tunneling distance 825 may further be increased. This is exemplified in FIG. 7B, where the vertical nanowire comprises graded InGaAs by which the Ga content is increased to further reduce the tunneling probability for the charge carriers. As a result of the tailored bandgap along the nanowire a tunneling distance 825 is achieved which is longer compared to the tunneling distance 815 for the homogenous material composition shown in FIG. 7A. Thus, charge carriers in a valence band 826 of the portion 824 of the vertical nanowire in the case shown in FIG. 7B must tunnel a longer tunneling distance 825 in a direction 822 to a conduction band 828, than in the case shown in FIG. 7A. To this end, a corresponding tunneling current for the case shown in FIG. 7B is smaller than a tunneling current for the case shown in FIG. 7A.

As discussed above, the field plate portion may be arranged in such a way that the wrap-around gate is further away from the center of the nanowire in a region with higher bandgap, whereas the wrap-around gate is closer to the center of the nanowire in a region with narrower bandgap.

An advantage of varying the material composition in such way is that additional control of the bandgap of a portion of the nanowire by the field plate portion may be achieved. An increased effective gate length may thereby be achieved.

An alternative to the graded material composition shown in FIG. 7B is shown in FIG. 7C. FIG. 7C is a graphical representation 830 of bandgap for a vertical nanowire of segmented material composition. The bandgap depicted in FIG. 7C is different than the bandgap structures shown in FIG. 7A and FIG. 7C, with a tunneling distance 835 from a valence band 836 of the portion 834 to a conduction band 838 of the vertical nanowire. In order for the charge carriers in the valence band 836 of the portion 834 of the vertical nanowire to tunnel to the conduction band 838 of the vertical nanowire, the charge carriers must tunnel the tunneling distance 835 in a direction 832. A reduced impact ionization may further be achieved. The tunneling distance 835 in FIG. 7C is larger than the tunneling distance 815 in FIG. 7A, and therefore the corresponding tunneling current for the case shown in FIG. 7C is smaller than for the case shown in FIG. 7A. A reduced leakage current and hence an enhanced control may therefore be achieved for the vertical MOSFET.

Thus, introducing a field plate portion in each respective wrap-around gate for the vertical nanowires may further increase the tunneling distances 815, 825, 835. In other words, by providing a vertical nanowire comprising a varying material composition in combination with a wrap-around gate including a field plate portion, the tunneling distance of the bandgap of the vertical nanowire may be increased and the performance of the vertical nanowire MOSFET thus improved.

Figure 3:
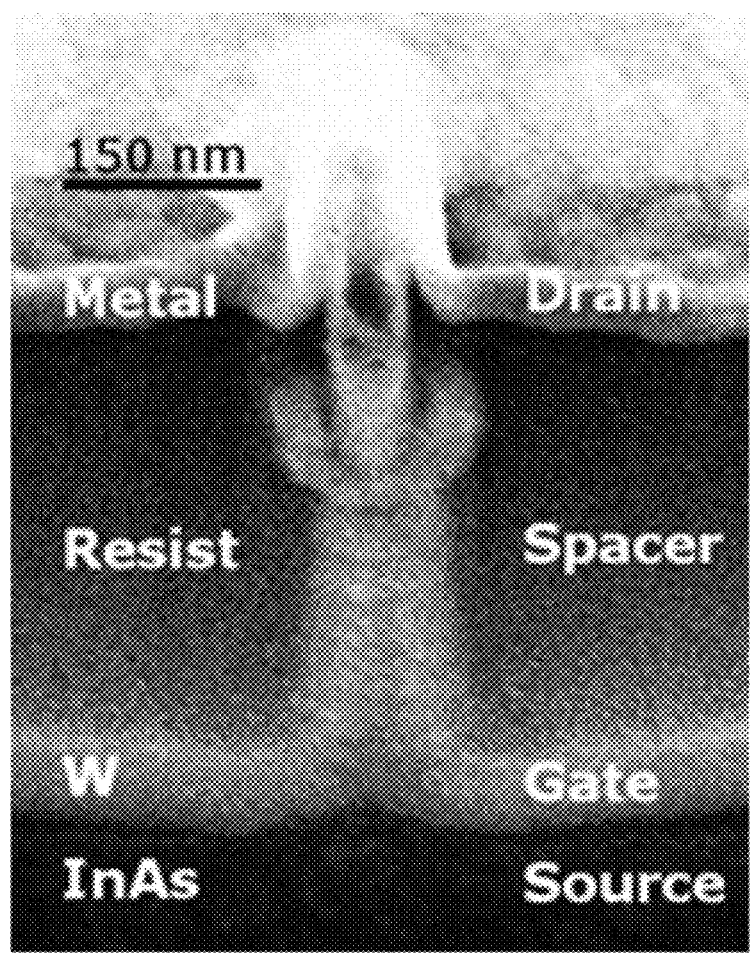
FIG. 3 illustrates a SEM micrograph of a vertical nanowire MOSFET.

FIG. 3 illustrates a SEM micrograph of a vertical nanowire MOSFET.

Figure 4:
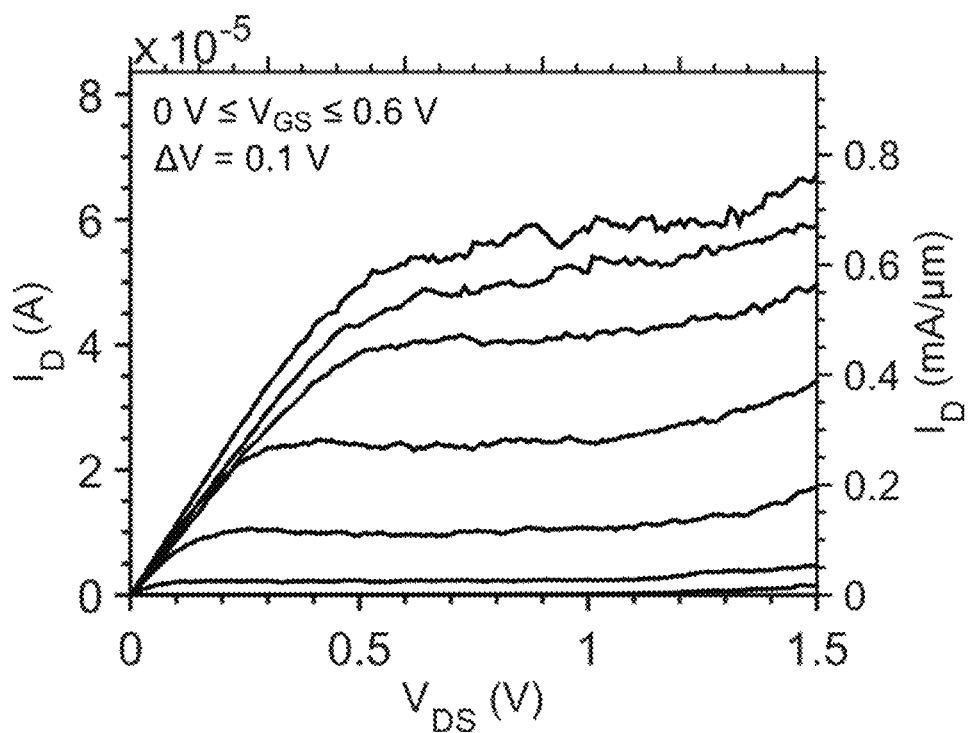
FIG. 4 illustrates measured output characteristics of a vertical nanowire MOSFET with a field-plate and graded InAs/InGaAs heterojunction.

FIG. 4 illustrates measured output characteristics of a vertical nanowire MOSFET with a field-plate and graded InAs/InGaAs heterojunction.

Figure 5:
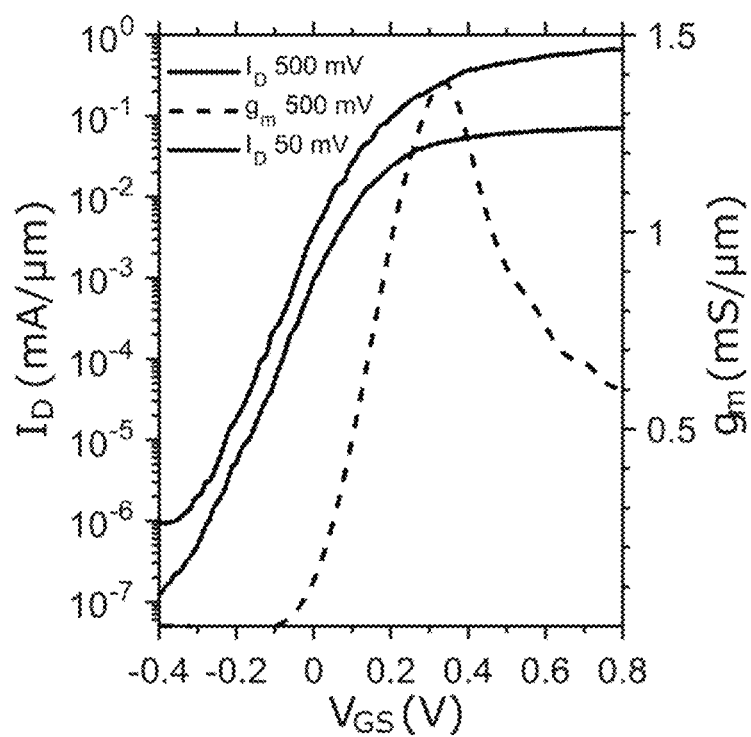
FIG. 5 illustrates measured transfer characteristics of a vertical nanowire MOSFET with a field-plate and graded InAs/InGaAs heterojunction.

FIG. 5 illustrates measured transfer characteristics of a vertical nanowire MOSFET with a field-plate and graded InAs/InGaAs heterojunction.

With reference to FIG. 1A-G, a method for forming a vertical MOSFET on a substrate 101 having a vertical nanowire 102 arranged on a first major surface 103 of the substrate 101 will be described. The substrate 101 in FIG. 1A-G is a semiconductor substrate, in this case Si. Alternatively, the semiconductor substrate may be a III-V compound material.

The vertical nanowire 102 shown in FIG. 1A-G has a coating 108 of a metal on an upper portion of the vertical nanowire 102. Alternatively, the coating 108 may be a semiconductor or may not be present at all. The vertical nanowire 102 in FIG. A-G has been grown directly on the substrate 101. Alternatively, the vertical nanowire 102 may be grown on an epitaxial layer deposited on the semiconductor substrate. The vertical nanowire 102 may be grown in several different ways, depending on the material composition of the vertical nanowire 102. For example, III-V or group IV nanowires may be grown using metal organic vapor-phase epitaxy using the vapor-liquid-solid method on electron-beam defined Au particles with typical sizes of 5 to 50 nm. Other methods of growing vertical nanowires are known in the art, such as growth on substrates with dielectric masks. The vertical nanowire 102 may also be defined by etching a semiconductor wafer in a top-down process. The vertical nanowire 102 may also be exposed to a regrowth step, where one or more masks are used along the nanowire to allow for semiconductor material deposition in one, two, or more areas along the vertical nanowire 102.

Figure 1B:
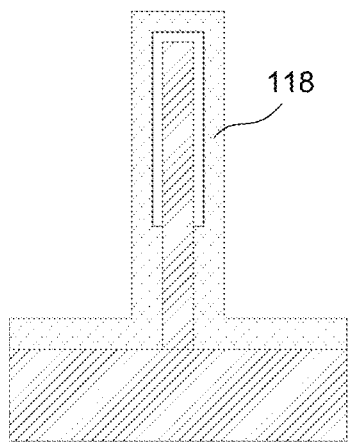
Figure 1C:
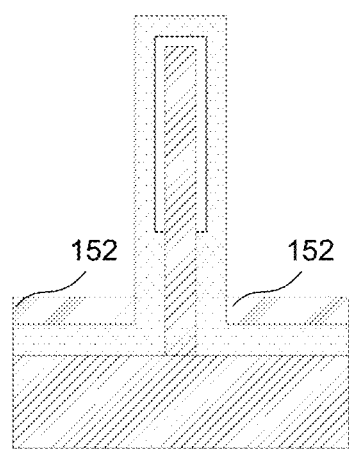
Figure 1D:
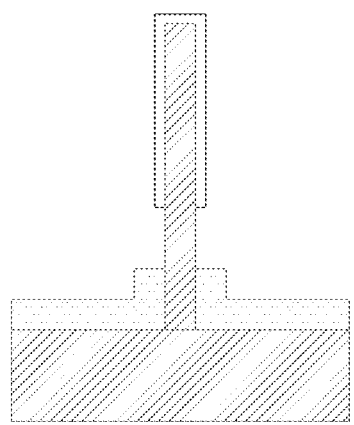
Figures 1, 1D:
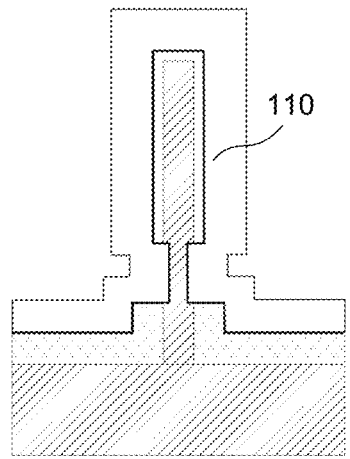

The vertical nanowire 102 in FIG. 1-G has a varying material composition, in this case the vertical nanowire 102 is formed by axial segments of varying material composition. The vertical nanowire 102 may also be formed by axial segments of varying doping. However, the vertical nanowire 102 may be homogenous in material composition and/or doping level.

In FIG. 1B, a dielectric layer 118 is formed by means of atomic layer deposition (ALD). Alternatively, the dielectric layer 118 may be deposited using chemical vapor deposition (CVD). The dielectric layer 118 covers outer surfaces of the vertical nanowire 102 and a portion of the first major surface 103 of the substrate 101 adjacent to the vertical nanowire 102. In this case, the dielectric layer 118 is $SiO_2$. Alternatively, the dielectric layer 118 may be SiN. The dielectric layer 118 may have a thickness in a range 50-100 nm.

In FIG. 1C, a first horizontal sacrificial layer 152 is formed, covering the dielectric layer 118 around a bottom portion of the nanowire 102. In FIG. 1C, the first horizontal sacrificial layer 152 is a photoresist layer, and may be hydrogen silsesquioxane (HSQ). The material composition of the first horizontal sacrificial layer 152 is such that the first horizontal sacrificial layer 152 may be used as an etch mask when exposed portions of the dielectric layer 118 are removed.

Exposed portions of the dielectric layer 118 are then removed, using the first sacrificial layer 152 as an etch mask. For example, exposed portions of the dielectric layer 118 may be removed by wet or dry etching chemistry. After the removal of the exposed portions of the dielectric layer 118, the first sacrificial layer 152 is removed, resulting in FIG. 1D.

Subsequent the removal of the first sacrificial layer 152, the vertical nanowire 102 in FIG. 1D-1 may be etched using the coating and the dielectric layer 118 as an etch mask. The radial extent of the vertical nanowire 102 is thereby locally decreased. The vertical nanowire 102 may be etched by etching an oxide formed on the vertical nanowire 102 or by atomic layer etching.

Subsequent to etching the vertical nanowire 102, a gate stack layer 110 has been formed, as shown in FIG. 1D-1. The gate stack layer 110 covers remaining portions of the dielectric layer 118 and exposed portions of the nanowire 102. The gate stack layer 110 in FIG. 1D-1 comprises a high-k dielectric, deposited by means of ALD. In this case, the high-k dielectric comprise $Al_2O_3$. Other examples of high-k dielectrics comprise $HfO_2$ and $ZrO_2$. The high-k dielectric may also be a combination of $Al_2O_3$, $HfO_2$ and/or $ZrO_2$. A metal layer has been deposited by means of sputtering in FIG. 1D-1, covering the gate stack layer 110. Alternatively, the metal layer may be deposited by means of CVD or metal evaporation.

Figures 1, 1D, 2:
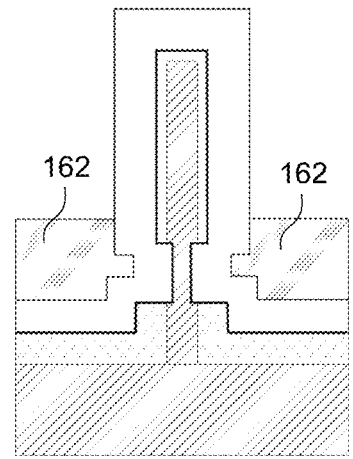

In FIG. 1D-2, a second horizontal sacrificial layer 162 has been formed, covering the metal layer around a bottom portion of the nanowire 102. In the example shown in FIG. 1D-2, the second horizontal sacrificial layer 162 may be HSQ.

Figure 1E:
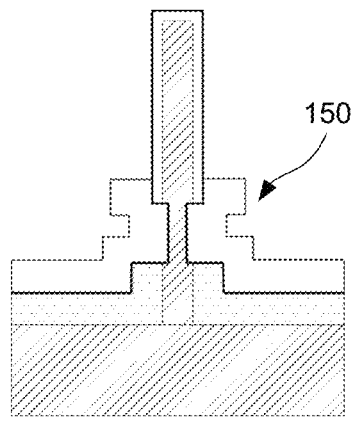

Exposed portions of the metal layer are then removed using the second sacrificial layer 162 as an etch mask. The exposed portions of the metal layer may be removed by dry or wet etching chemistry. After the removal of the exposed portions of the metal layer, exposed portions of the gate stack layer 110 are removed using the second sacrificial layer 162 as an etch mask. The exposed portions of the gate stack layer 110 may be removed by dry or wet etching chemistry. In this example, the exposed portions of the metal layer and the exposed portions of the gate stack layer 110 are removed in the same process. FIG. 1E is then reached by removing the second sacrificial layer 162. Upon removal of the second sacrificial layer 162, a wrap-around gate 150 is exposed, enclosing the vertical nanowire 102 circumference. The wrap-around gate 150 is formed of remaining portions of the gate stack layer 110 and the metal layer.

A height of the wrap-around gate 150 shown in FIG. 1E is defined by an upper surface of the second sacrificial layer 162. In other words, the extension of the wrap-around gate 150 along the longitudinal direction of the vertical nanowire 102 is determined by the thickness of the second sacrificial layer 162.

Figure 1F:
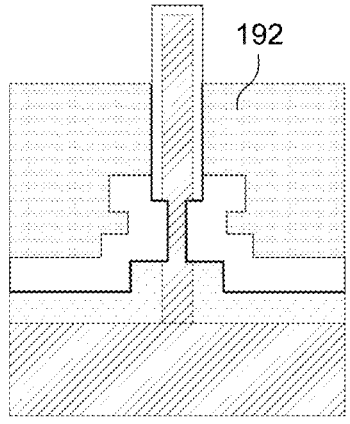
Figure 1G:
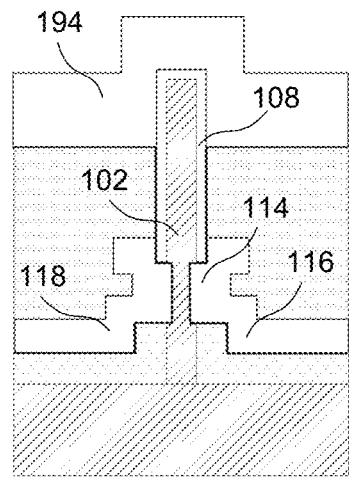

In FIG. 1F, a spacer layer 192 has been formed, and in FIG. 1G a top contact 194 has been formed at a top portion of the vertical nanowire 102. In the example shown in FIG. 1G, the gate portion 114 is arranged above the field plate portion 116 of the wrap-around gate 150. The field plate portion 116 is separated from the nanowire 102 by remaining portions of the dielectric layer 118.

An alternate method of forming a vertical MOSFET will now be described in relation to FIG. 2A-H.

The transistor structure may alternatively be fabricated using five general steps.

In a first step, the top spacer deposition to be used as a field-plate is initiated. A sacrificial layer 252 is deposited on the sample covering the lower part of the nanowires, see FIG. 2B. The spacer material 292 is deposited with 50-100 nm thick ALD or CVD deposited dielectric, such as $SiO_2$ or SiN, see FIG. 2C. Anisotropic etching is used to remove the dielectric film on the surface planar to the substrate 201 and finally the sacrificial layer 252 is removed, see FIG. 2D.

Figure 2A:
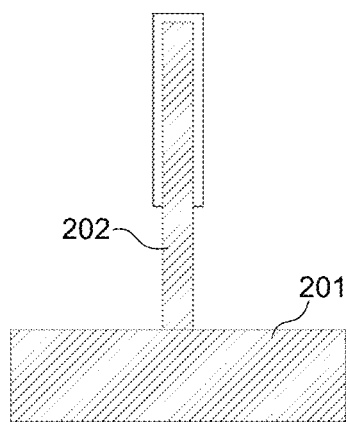
FIG. 2A-H illustrates an alternative process flow describing how to fabricate a field-plate on a vertical nanowire.
Figure 2B:
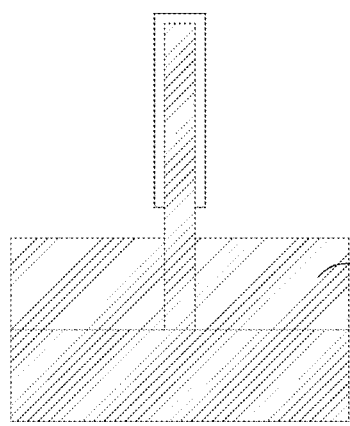
Figure 2C:
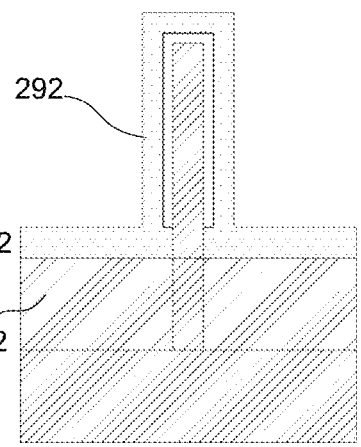
Figure 2D:
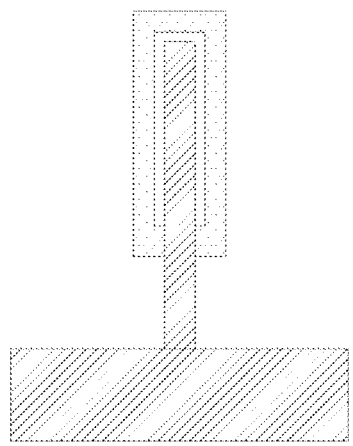
Figure 2E:
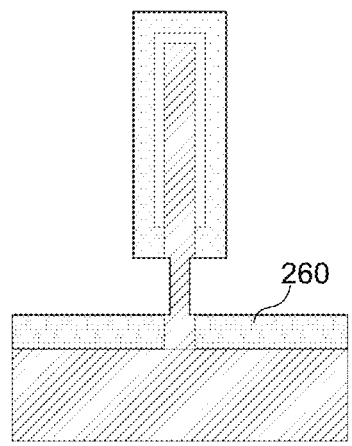

In a second step, see FIG. 2E, the bottom spacer 260 is defined by spin-coating the sample with HSQ and defining the thickness of the layer by exposure and development. The thickness of the bottom spacer 260 is thinner than the sacrificial layer 252 in step one.

Figure 2F:
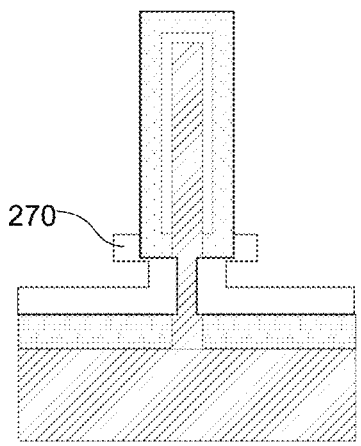
Figure 2G:
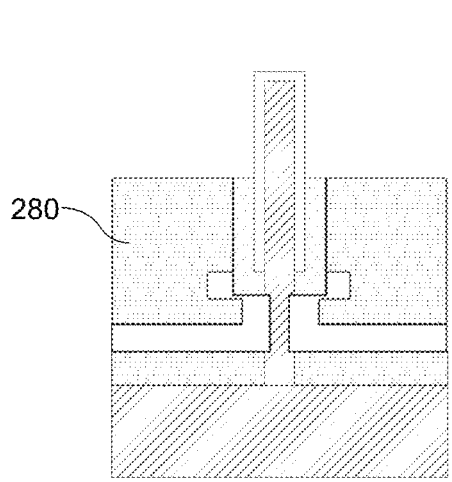

In a third step, the gate is formed and the gate stack 270 deposited, see FIG. 2F. In this step, the formed spacer layer 292 may be used as an etching mask to form a recess gate by wet or dry chemical etching. Alternatively, the semiconductor nanowire 202 is not etched. The gate stack 270 is then deposited by a number of steps including ALD deposition of high-k dielectrics (such as $Al_2O_3$, $HfO_2$, $ZrO_2$, etc., or combinations thereof). The metal gate is deposited by metal evaporation or sputtering or CVD deposition. The metal gate is defined by deposition of a second sacrificial layer 280 that is deposited on the sample and used to etch the gate stack on the upper part of the nanowire to define the gate length.

In an alternate fourth step, metal is evaporated to increase the thickness of the layer covering the bottom spacer.

Figure 2H:
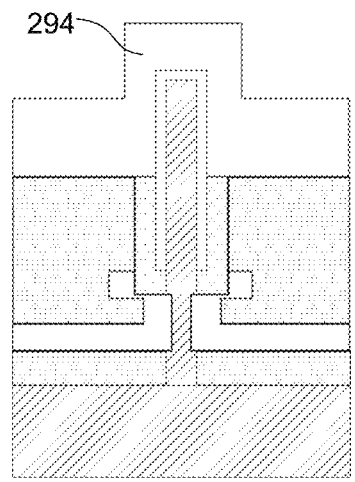

The transistor process is then completed in a fifth step by contacting the gate and the transistor top ohmic contact 294 separately as well as the formation of the bottom electrode, see FIG. 2H.

A benefit of the presented embodiments is that a field-plate is formed in that the gate metal will act on the channel with various distances from the center of the nanowire. This distance is, preferably, defined by post-growth pattering.

It is understood that various processing techniques can be used for deposition and etching. Examples of conditions can be found in the literature. A further benefit is that the top ohmic contacts may be formed prior to the gate definition process using the gate-last process. Alternatively, the contact may be processes at the end, as described above.

The person skilled in the art realizes that the present invention by no means is limited to the preferred variants described above. On the contrary, many modifications and variations are possible within the scope of the appended claims. Additionally, variations to the disclosed variants can be understood and effected by the skilled person in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage.

In the following, further aspects of vertical MOSFETs will be described.

As discussed a field-plate is introduced into the transistor design. The field-plate consists of a wrap-gate surrounding the III-V nanowire channel, where the distance from the metal gate to the middle of the nanowire is altered along the vertical gate direction. The field-plate is preferable formed subsequent to the top metal definition and is aligned to semiconductor heterostructures formed within the nanowire.

The radius of the gate metal may vary along the vertical nanowire channel.

The top ohmic contact may be fabricated prior to the gate formation using a gate-last process.

The top metal electrode may first be deposited and then used as an etching mask to reduce the diameter of the nanowire transistor channel prior to gate definition and the gate includes a field-plate.

The vertical nanowire MOSFETs, fabricated with field-plates, may be used in digital applications where one or several nanowires are connected in groups forming circuits.

The vertical nanowire MOSFETs, fabricated with field-plates, may be used in RF- or millimeterwave applications where one or several nanowires are connected in groups forming circuits.

The vertical nanowire MOSFETs, fabricated with a field-plate, may be used in mixed-mode or memory applications where one or several nanowires are connected in groups forming circuits.

Vertical Tunnel Field-Effect-Transistors (FETs) fabricated with the field-plates, where the nanowire consists of an axial heterostructure pn-junction and the gate may be used to aligned the junction to implement the Tunnel FET.

The nanowire MOSFETs may be fabricated on semiconductor substrates (such as Si or III-V compound material). The nanowires with 5 to 50 nm diameter may be grown either directly on the substrate or on an epitaxial layer deposited on the semiconductor wafers. III-V or group IV nanowires (such as InAs, InGaAs, GaSb, Si and combinations thereof) may be grown using metal organic vapor-phase epitaxy using the vapor-liquid-solid method on electron-beam defined Au particles with typical sizes of 5 to 50 nm. Alternatively, other methods to grow the nanowires may be used, such as growth on substrates with dielectric (SiO2 or SiNx) masks. The nanowires may also be defined by etching of the semiconductor wafer in a top-down process. Furthermore, the nanowires may be exposed to a regrowth step, where one or more masks are used along the nanowires to allow for semiconductor material deposition in one, two, or more areas along the nanowires. The nanowires may be arranged in certain configurations, such as in double row arrays with 50 to 200 nm spacing or in geometrical patterns such as hexagonal patterns. The nanowires may further be homogenous in material composition and doping level or they may be formed by axial segments of varying doping or material composition, such as a 200 nm long undoped bottom section followed by a 400 nm long highly doped section.

For Tunnel FETs, the nanowires may consist of GaSb/InAs pn-junctions where the gate is located in the direct vicinity of the heterojunction. In a perfect configuration, the gate is aligned to the heterojunction, but overlap and underlap of 0 to 50 nm may be considered as well. The nanowires may further contain radial heterostructures or doping variation formed in core/shell heterostructures, such as an intrinsic InAs (or InGaAs) core overgrown by a highly doped InAs (or InGaAs) shell. Nanowires may in this context refer to semiconductor rods consisting of one single material or alternatively of core/shell nanowires where a second material has been epitaxial grown on the side facets of the first nanowire with the goal of providing enhanced functionality such as channel access resistance, reduced strain for transport enhancement, or surface passivation. Alternatively, we may also consider axial heterostructure nanowires where segments of two or more different materials and doping levels have been combined within the nanowire. These nanowires may be used as transistor channels in vertical MOSFETs where an upper electrode is formed on the top of the nanowire and serves as an ohmic contact to the nanowire. The electrode may consist of a metal contact as well as a semiconductor contact region. The gate is located below the upper electrode whereas the third electrode is located below the gate or on the substrate in connection to the nanowire. The third electrode serves as a second ohmic contact to the transistor.

The transistor nanowire channel may consist of a graded heterojunction where the material composition is varied in such a way that it has the largest band gap closest to the substrate. One example being a graded $In_xGa_{1-x}As$ heterostructure with the highest Ga concentration close to the substrate. The field-plate may be arranged in a way that the gate is further away from the middle of the nanowire in the region with the higher band gap (such as a higher Ga concentration), whereas it is closer to the middle of the nanowire in the region with the narrower band gap (such as lower Ga concentration). Below the gate and the adjacent graded heterostructure mentioned above, other segments may be included in the nanowire, including material with a narrower band gap, such as InAs.

To fabricate the transistor structure four major process steps may be performed as exemplified below:

In a first step, the bottom spacer deposition is initiated by depositing 50-100 nm thick ALD or CVD deposited dielectric, such as $SiO_2$ or SiN.

In a second step, the field-plate spacer layer is formed by deposition of a sacrificial layer, for instance a photo resist layer, which is about 100 nm thick. This layer is used as a mask to etch the above mentioned dielectric by wet chemistry or by dry etching chemistry. Since the lower part of the nanowire is protected by the sacrificial layer, the etching occurs on the upper parts of the nanowire only forming the basis of the field-plate structure. The sacrificial layer is then removed.

In a third step, the gate is formed and the gate stack deposited. In this step, the formed spacer layer may be used as an etching mask to form a recess gate by wet or dry chemical etching. Alternatively, the nanowire semiconductor nanowire is not etched. The gate stack is then deposited by a number of steps including ALD (Atomic Layer Deposition) of high-k dielectrics (such as $Al_2O_3$, $HfO_2$, $ZrO_2$, etc., or combinations thereof). The metal gate is deposited by metal evaporation or sputtering or CVD (Chemical Vapor Deposition). The metal gate is defined by deposition of a second sacrificial layer that is deposited on the sample and used to etch the gate stack on the upper part of the nanowire to define the gate length. The metal gate is defined along the nanowire in such a way that it connects to the graded heterostructure. In particular, the metal gate surrounds part of, or complete, heterostructure.

The transistor process is then completed in a forth step by contacting the gate and the transistor top ohmic contact separately as well as the formation of the bottom electrode.

The transistor channel may consist of a graded heterojunction where the material composition is varied in such a way that it has the narrowest band gap closest to the substrate. One example being a graded $In_xGa_{1-x}As$ heterostructure with the lowest Ga concentration close to the substrate. The field-plate is arranged in a way that the gate is further away from the middle of the nanowire in the region with the higher band gap (such as a higher Ga concentration), whereas it is closer to the middle of the nanowire in the region with the narrower band gap (such as lower Ga concentration).

A prestate vertical nanowire MOSFET will now be described. The gate is arranged relative to a centre of the nanowire, i.e. a central long axis, at a distance r1. The field plate is arranged relative to a centre of the nanowire at a distance r2 The radius r2 may larger than r1. The field plate and the gate may be uniformly formed. The field plate and the gate may be formed as two separate elements. The two separate elements may be in electrical contact with each other. The gate and the field plate may be formed by different materials such as different metals having different work functions. The gate may be stepped. The gate and the field plate may form a stepped structure.

A dielectric layer arranged between the gate and the nanowire may have a first thickness t1. A dielectric layer arranged between the field plate and the nanowire may have a second thickness t2. The second thickness t2 may be larger than the first thickness t1. The first and second dielectric layers may be made of the same or different dielectric material. As distance from the surface of the nanowire to an inner surface of the field plate may be larger than the distance from the surface of the nanowire to an inner surface of the gate, the distances being measured in a plane perpendicular to the central long axis of the nanowire.

The gate and/or the field plate may be arranged to enclose the nanowire around its circumference.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

The foregoing has described the principles, preferred embodiments and modes of operation of the present invention. However, the invention should be regarded as illustrative rather than restrictive, and not as being limited to the particular embodiments discussed above. The different features of the various embodiments of the invention can be combined in other combinations than those explicitly described. It should therefore be appreciated that variations may be made in those embodiments by those skilled in the art without departing from the scope of the present invention as defined by the following claims.

The invention claimed is:

1. A vertical metal oxide semiconductor field effect transistor (MOSFET) comprising:
   a nanowire forming a charge transport channel between a source contact and a drain contact; and
   a wrap-around gate enclosing the nanowire circumference, the wrap-around gate having an extension spanning over a portion of the nanowire in a longitudinal direction of the nanowire,
   wherein the wrap-around gate comprises a gate portion and a field plate portion for controlling a charge transport in the charge transport channel,
   wherein the field plate portion is arranged at a first radial distance from the center of the nanowire and the gate portion is arranged at a second radial distance from the center of the nanowire, wherein the first radial distance is larger than the second radial distance,
wherein a bandgap of the nanowire is larger at the level of the field plate portion than at the level of the gate portion, and
wherein the field plate portion is adjacent to the source contact.

2. The vertical MOSFET according to claim 1, wherein a material composition of the nanowire along the longitudinal direction of the nanowire is varied gradually.

3. The vertical MOSFET according to claim 1, wherein the material composition along the longitudinal direction of the nanowire is segmented.

4. The vertical MOSFET according to claim 1, wherein a material composition of the nanowire comprises InxGa1-xAs.

5. The vertical MOSFET according to claim 1, wherein the wrap-around gate comprises a high-k dielectric.

6. The vertical MOSFET according to claim 1, wherein a radial extension of the nanowire is smaller at the gate portion than at the field plate portion.

7. The vertical MOSFET according to claim 1, wherein the nanowire has a radial extension in a range of 2.5 nm to 25 nm.

8. The vertical MOSFET according to claim 1, wherein the gate portion has an extension in the longitudinal direction of the nanowire in a range of 10 nm to 500 nm, and wherein the field plate portion has an extension in the longitudinal direction of the nanowire in a range of 10 nm to 1000 nm.

9. The vertical MOSFET according to claim 1, wherein a ratio between the first radial distance and the second radial distance is in a range of 1.1 to 5.

10. A method for forming a vertical metal oxide semiconductor field effect transistor (MOSFET) on a substrate having a vertical nanowire arranged on a first major surface of the substrate, the method comprising:
    forming a dielectric layer covering outer surfaces of the nanowire and a portion of the first major surface of the substrate adjacent to the nanowire;
    forming a coating on an upper portion of the nanowire prior to forming the dielectric layer
    forming a first horizontal sacrificial layer covering the dielectric layer around a bottom portion of the nanowire;
    removing exposed portions of the dielectric layer using the first sacrificial layer as an etch mask;
    removing the first sacrificial layer;
    forming a gate stack layer covering remaining portions of the dielectric layer and exposed portions of the nanowire, wherein the gate stack layer comprises a high-k dielectric layer and a metal layer;
    etching the nanowire, subsequent to removing the first sacrificial layer and prior to forming the gate stack layer, using the coating and/or the dielectric layer as an etch mask, thereby locally decreasing a radial extent of the nanowire;
    forming a second horizontal sacrificial layer covering the gate stack layer around a bottom portion of the nanowire;
    removing exposed portions of the gate stack layer using the second sacrificial layer as an etch mask;
    removing the second sacrificial layer, thereby exposing a wrap-around gate enclosing the nanowire circumference, the wrap-around gate being formed of remaining portions of the gate stack layer and the metal layer; and
    forming a top contact at a top portion of the nanowire.

11. The method according to claim 10, wherein an upper surface of the second sacrificial layer defines a height of the wrap-around gate.

* * * * *